Jan. 15, 1963 M. V. SULLIVAN 3,073,764

PROCESS FOR ELECTROPOLISHING SEMICONDUCTOR SURFACES

Filed April 13, 1960

INVENTOR
M. V. SULLIVAN
BY
ATTORNEY

United States Patent Office 3,073,764
Patented Jan. 15, 1963

3,073,764
PROCESS FOR ELECTROPOLISHING SEMICONDUCTOR SURFACES

Miles V. Sullivan, Summit, N.J., assignor to Bell Telephone Laboratories, Incorporated, New York, N.Y., a corporation of New York
Filed Apr. 13, 1960, Ser. No. 22,027
2 Claims. (Cl. 204—140.5)

Figure 1:
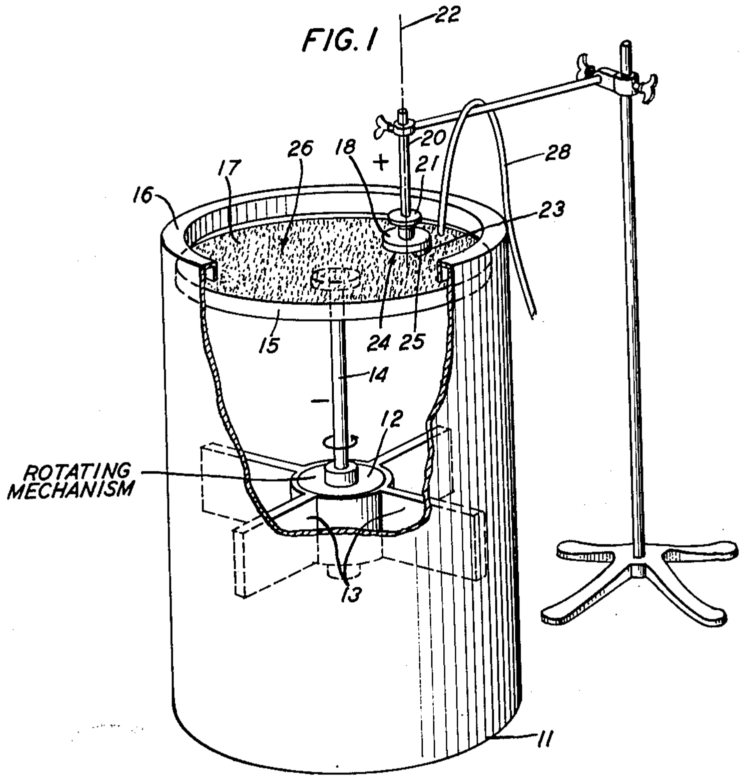

This invention relates to electropolishing. The invention has special importance in the electropolishing of semiconductors but its use is not limited thereto.

In the fabrication of semiconductor devices it is necessary to prepare the semiconductor starting material in slices which have flat, smooth, damage-free surfaces. This is particularly critical for "diffused" devices because imperfect surfaces disturb the even passage of the diffusant into the semiconductor slices. This in turn deleteriously affects the electrical characteristics of the device.

Several techniques such as electropolishing, chemical etching and mechanical lapping and polishing surfaces of semiconductor slices are well known and presently in use in the semiconductor art. By lapping and polishing techniques a surface can be prepared which is about 0.0001 inch per inch flat. The average roughness of this surface is typically 0.3 microinch. This surface is smooth and flat enough for good device fabrication but the mechanical damage which is still present on the surface deleteriously affects the electrical characteristics of devices. Typically, it is necessary to remove such damaged surface before further processing.

Accordingly, one object of this invention is an inexpensive method for preparing the surfaces of semiconductor slices within very exacting tolerances in flatness, smoothness and damage.

In accordance with this invention relatively damage-free surfaces are provided which are smoother and flatter than the surfaces provided by the prior art. In addition, such surfaces are obtained in considerably less time than is possible with the techniques of the prior art.

The invention comprises an electropolishing technique wherein the surface to be polished is constantly disturbed by a stirring mechanism proximate the surface.

In particular, one feature of this invention is the step of passing a stirring means along a plane closely adjacent the surface of interest.

The advantages of an electropolishing technique in accordance with this invention are indicated by a comparison between a prior art process and an embodiment of this invention. As mentioned above, it is the practice of the prior art to remove the residual mechanical damage from lapped surfaces before further processing by chemically etching the surfaces. Chemical etching, however, increases the average roughness of a typical surface to about 3.0 microinches or greater. Thus the gain in removing mechanical damage by the chemical etching technique is obtained at the expense of increasing the average roughness. In order to obtain a surface which is sufficiently damage-free and still maintain a low average roughness and suitable flatness, the above two processes, namely mechanical polishing and then chemical etching are generally alternated several times. Typically, a manufacturing process for fabricating diffused devices entails six separate steps to achieve suitable surfaces. This processing is expensive. For example, the manufacturing cost of preparing satisfactory semiconductor surfaces in this fashion typically, is more than two and one half times the cost of the semiconductor material and all of the processing of the material up to this point.

An embodiment in accordance with this invention comprises an electropolishing technique wherein the material to be polished is mounted on a rotatable disk such that the surface of interest is exposed. A second rotatable disk covered by a low pile cloth is positioned proximate the surface of interest such that the pile of the cloth is almost, or at most just barely, in contact with the surface of interest. The second disk is rotated about an axis of rotation parallel to but displaced laterally from that about which the first disk is rotated. A suitable electrolyte is provided to a level above the pile of the cloth for contacting the surface of interest. The rotation of the stirring disk is used to stir continuously the electrolyte close to the surface of interest. By this technique surfaces smooth to better than .2 microinch, flat to better than .0001 inch and free of mechanical damage have been prepared in less than one-tenth the time required by the prior art. More specifically, a typical rate of mechanically polishing a surface is .0003 inch per hour. A typical rate of polishing in accordance with this invention exceeds this rate by over two orders of magnitude. The manufacturing cost of preparing satisfactory semiconductor surfaces in accordance with the subject invention can be about one-tenth the cost of the semiconductor material and all of the processing of the material up to this point.

In this application the terms "rough" or "smooth" and "flat" or "even" are used consistently with the description of surface irregularities as shown on page 141 of "The Story of Superfinish," by Arthur M. Swigert, Jr., a Lynn Publishing Company 1940 publication. For example, the terms "rough" or "smooth" refer to microscopic discontinuities while the terms "flat" or "even" refer to the pitch of the surface.

Figure 2:
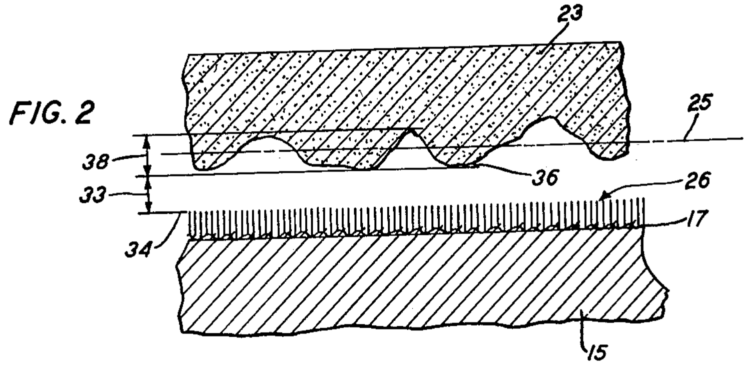

The invention and its various objects and features will be understood better from the following detailed description rendered in conjunction with the following drawing wherein:

FIG. 1 is a perspective view partially in cross section of the semiconductor slice and the apparatus of this invention, and FIG. 2 is an enlarged view partially in cross section of a portion of the surface of the semiconductor slice and the stirring mechanism.

It is to be understood that the figures are illustrative only and not necessarily to scale.

Referring to FIG. 1, a cylindrical container 11 contains a centrally located rotating mechanism 12, typically an electric motor, secured to the container by supports 13. A metallic shaft 14 transmits angular motion from the rotating mechanism to the metallic stirring disk 15 positioned immediately below the annular lip 16 of the cylindrical container 11. The metallic stirring disk 15 is covered by a low pile cloth 17. The disk shaped block 18 is secured to a holder 20 by a suitable connection which allows block 18 to rotate about an axis of rotation 22 which is parallel to but eccentrically disposed to shaft 14. At least one semiconductor slice 23 is affixed to the surface 24 of block 18 such that the surface 25 of the semiconductor slice 23 is in contact with the pile 26 of the low pile cloth 17. Typically low pile cloth 17 is a velvet like material such as Gamal cloth which is obtained commercially from Fisher Scientific Company. The term low pile, however, refers to any cloth having a pile of height of approximately .030 inch or less. Tube 28 provides a continuous supply of electrolyte. The level of the electrolyte is kept sufficiently high that the surface of interest is wet by it. External means (not shown) is provided for maintaining the stirring disk electrically negative with respect to the slice of semiconductor material.

In operation, slice 23 either is made to rotate independently of stirring disk 15, or is dragged by the rotation of the disk. In either instance, the result is a continuously changing direction of polishing for the slice 23 because of the eccentric arrangement of the axis of rotation 22 and the shaft 14.

FIG. 2 shows, on an expanded scale, the spatial relation of the various elements for optimum operation.

In particular, the spatial relations are such that the pile 34 is separated advantageously from the high points 36 of the surface a distance 33 which is of the same order of magnitude, preferably between three times and a third, as the depth 38 of an average depression below the surface. However, it is tolerable if the pile makes grazing contact with the high points of the surface.

Experiments have shown that by maintaining the stirring means at such a distance, the etch rate at the high points can be increased by at least a factor of ten. This results in semiconductor surfaces which are smooth to within 0.2 microinch and flat to within 0.0001 inch over a square inch of surface area in less than thirty minutes.

The above-mentioned cloth covers the stirring disk to prevent mechanical contact between the surface of interest and the disk and makes possible intimate stirring with the disk removed from the surface of interest as is described below. However, the pile of the cloth has a tendency to round the edges of the semiconductor slice. For example, when an 0.01 inch thick slice is polished down to 0.005 inch with a velvet-like cloth whose pile is .010 to 0.020 inch high about ten percent of the slice surface area is rendered useless because of this rounding effect. Rounding is even more evident if thinner slices are prepared from 0.01 inch material in this manner. Reducing the height of the pile correspondingly reduces this loss.

However, in order to avoid this loss of material in the fabrication of slices of about .0005 inch thick or less, the cloth is eliminated from the system and the stirring disk is moved to a distance from the surface of interest of the order of the depth of the surface discontinuities. This is accomplished by allowing the semiconductor slice to float on a thin film of electrolyte.

If the slice of semiconductor material is not positioned properly with respect to the stirring disk, uneven and scratched surfaces result because of mechanical contact between the surface and the disk. In systems employing the cloth covered disk, considerable latitude in positioning the semiconductor slice is afforded by the pile of the cloth. On the other hand extra care is necessary in positioning the semiconductor slice in systems employing the uncovered disk. To alleviate any difficulty in positioning, 5 to 10 micron diameter balls of polydivinylbenzene may be added to the electrolyte to support the slice. The area lost from thin slices prepared in this manner is less than one-half percent of the surface of the slice.

Slices of p-type germanium have been prepared as follows. Slices varying in thickness from 0.025 inch to 0.001 inch have been prepared using stirring disks covered with Gamal cloth and silk respectively. Employing current densities of from 0.001 to 2 amperes per centimeter squared surfaces were prepared which varied less than .001 inch per square inch and which had an average roughness of less than 0.2 microinch.

In particular a slice of p-type germanium material 1 inch by ½ inch by .010 inch was prepared in accordance with this invention by securing a surface of the slice in contact with a Gamal cloth affixed to a 7 inch diameter stirring disk in the fashion shown in FIG. 1 of the drawing. The pile of the cloth was approximately 0.01 inch. The electrolyte was 1 gram potassium hydroxide to 1000 milliliter water. The stirring disk was rotated at 100 revolutions per minute and the semiconductor slice was dragged about its own axis. A current of 1.0 ampere was flowing through the system. This corresponds to an anode current density of two amperes per square inch. In a period of 19 minutes the thickness of the semiconductor slice was reduced from 0.010 to 0.005 inch. In this same period the smoothness of the surface of the slice changed from 0.00001 to 0.0000002 inch and the flatness changed from 0.0006 to 0.0001 inch per inch.

The stirring disk is charged negative by the application of an appropriately poled bias between the semi-conductor slice and the disk. The resulting electrolytic action is accompanied by a release of gas bubbles from the surface of the disk. These bubbles have a tendency of separating the cloth covering from the surface of the disk. When a low pile cloth is employed, the semiconductor surface is often scratched by the body of the cloth. To avoid scratching the semiconductor surface in this manner, the angular velocity of the disk is increased as the pile of the cloth is descreased. Experiment indicates that the increased velocity of the disk counteracts the effect of the gas bubbles on the cloth.

The polished surface, correspondingly, is maintained electrically positive. In the polishing of semiconductor material this requires a supply of holes from the semiconductor material. Holes are readily available in p-type material. However, if it is desired to polish n-type material in accordance with this invention, a means for supplying holes is advantageously coupled to the semiconductor material. Several such means are available. For example, providing strong illumination which generates holes and electrons in the semiconductor or providing an injecting contact are satisfactory means for supplying holes to n-type semiconductor material.

Although particular interest in damage-free surfaces arises in semiconductor work, this invention is applicable to the polishing of all material which can be dissolved at an anode. The electrolyte is selected accordingly as is well known in the art. For example, in polishing p-type silicon five parts of hydrofluoric acid to ninety-five parts water are used as the electrolyte. In polishing aluminum, the electrolyte consists of 820 milliliters of ortho phosphoric acid, 135 milliliters of sulfuric acid, 160 grams of chromic oxide and 40 milliliters of water.

As is noted above, one of the purposes of the cloth affixed to the stirring disk is to separate the surface to be polished from the disk. As the pile height is increased to the thickness of the slice being polished, and beyond, increasing pressure is brought to bear against the edges of the slice and the semiconductor surface. A secondary brushing action by the pile then is increasingly evident. Statistically, in this system, the high points on the surface to be polished are disturbed by the brushing as well as by the primary stirring action more than the low points on the surface. Since brushing has a similar effect to that of stirring on the surface of the semiconductor slice, this appears to be desirable. However, this secondary brushing is uncontrolled and interferes with the preparation of a suitably flat surface. Additionally, increased pressure occasions increased loss of material due to rounding. The optimum operation is obtained within the limits of distance and pile heights described above.

No effort has been made to describe all possible embodiments of the invention. It should be understood that the embodiments described are merely illustrative of the preferred form of the invention and various modifications may be made therein without departing from the spirit and scope of this invention.

What is claimed is:

1. A process for electropolishing a surface having high points and depressions therein, said process comprising the steps of mounting eccentrically on a first disk a semiconductor wafer for exposing a surface of said wafer, said disk being capable of rotation about a first central axis, spacing said exposed surface of said mounted semiconductor wafer from a second disk, said second disk being capable of rotation about a second central axis, said first and said second axes being noncoincident, fixing a cloth to said second disk, said cloth having a pile less than about .030 inch, spacing the top of said pile a distance from a plane through the high points of said surface of between three times and a third the depth of the average depression, introducing an electrolyte for filling the space between said semiconductor wafer and said second disk, initiating a current flow between said semiconductor wafer and said second disk, said current flow being of a direction for maintaining said wafer positive with respect to said second disk, and rotating said first and second disk for a time to remove the high points from said surface of said wafer.

2. A process in accordance with claim 1 wherein said semiconductor wafer is germanium, said electrolyte comprises a solution consisting essentially of one gram of potassium hydroxide per 1,000 milliliters of water, and the anode current density is about 2 amperes per square inch.

References Cited in the file of this patent

UNITED STATES PATENTS

| | | |
|---|---|---|
| 2,294,227 | De Laplace | Aug. 25, 1942 |
| 2,539,455 | Mazia | Jan. 30, 1951 |
| 2,590,927 | Brandt | Apr. 1, 1952 |
| 2,939,825 | Faust | Apr. 9, 1960 |
| 2,965,556 | Damgaard | Dec. 20, 1960 |
| 2,983,655 | Sullivan | May 9, 1961 |

FOREIGN PATENTS

| | | |
|---|---|---|
| 576,351 | Canada | May 26, 1959 |